US012794423B2

(12) United States Patent
Darvishi et al.

(10) Patent No.: US 12,794,423 B2
(45) Date of Patent: Nov. 10, 2026

(54) PHASE SHIFTER CIRCUIT WITH EMBEDDED IMPEDANCE MATCHING

(71) Applicant: Apple Inc., Cupertino, CA (US)

(72) Inventors: Milad Darvishi, San Diego, CA (US); Seyed Milad Moosavifar, San Jose, CA (US); Morteza Nick, San Francisco, CA (US); Yi Zhao, San Jose, CA (US)

(73) Assignee: Apple Inc., Cupertino, CA (US)

( * ) Notice: Subject to any disclaimer, the term of this patent is extended or adjusted under 35 U.S.C. 154(b) by 725 days.

(21) Appl. No.: 18/121,426

(22) Filed: Mar. 14, 2023

(65) Prior Publication Data

US 2024/0313716 A1 Sep. 19, 2024

(51) Int. Cl.
*H03F 3/191* (2006.01)
*H03F 1/56* (2006.01)
*H03F 3/24* (2006.01)
*H03F 3/45* (2006.01)

(52) U.S. Cl.
CPC ............. *H03F 3/245* (2013.01); *H03F 1/565* (2013.01); *H03F 3/45475* (2013.01); *H03F 2200/294* (2013.01); *H03F 2200/451* (2013.01)

(58) Field of Classification Search
CPC ........... H03F 3/191; H03F 3/193; H03F 3/195
USPC ......................................... 330/302, 305, 306
See application file for complete search history.

(56) References Cited

U.S. PATENT DOCUMENTS 4,147,997 A * 4/1979 Greaves .................... H02J 1/02 333/216
7,292,103 B2 11/2007 Park et al.
7,474,150 B2 * 1/2009 Schemmann ...... H04N 7/17309 330/306
9,407,216 B2 * 8/2016 Kohama .................. H03F 3/24
10,256,865 B2 4/2019 Perumana et al.

FOREIGN PATENT DOCUMENTS

WO 2004084422 A2 9/2004

* cited by examiner

*Primary Examiner* — Henry Choe
(74) *Attorney, Agent, or Firm* — FLETCHER YODER PC

(57) ABSTRACT

This disclosure is directed to amplifiers including amplification circuitry, phase-shifting circuitry, and impedance matching circuitry. An amplifier may include multiple amplifier stages each amplifying an input signal by a portion of a total amplification factor of the amplifier. The amplifier may include multiple phase shifters each including a matching circuit embedded thereon. Each phase shifter may shift a phase of the input signal by a portion of a total phase shift value of the amplifier. Moreover, at least some phase shifters may provide an output signal at an output port having an output impedance matching (e.g., nearly matching) an input impedance of a subsequent circuit coupled thereto. The amplifier may include cascaded amplifier stages and phase shifters coupled to the subsequent circuit such as an antenna, a processor, and/or a memory device.

20 Claims, 7 Drawing Sheets

PHASE SHIFTER CIRCUIT WITH EMBEDDED IMPEDANCE MATCHING

BACKGROUND

The present disclosure relates generally to wireless communication, and more specifically to amplifiers of transmitter and/or receiver circuits.

In some applications, such as high frequency (e.g., millimeter wave (mmWave)) application, an electronic device may form narrow beams to transmit and/or receive radio frequency (RF) signals. As such, the electronic device may include an increased number of antennas and data communication chains to form the narrower beams. If not compensated for, the data communication chains may occupy an increased circuit area. Such increases in a circuit area of the electronic device is undesired.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, an amplifier is described including a first amplifier stage, a second amplifier stage, and a first phase-shifting matching network coupled to the first amplifier stage and the second amplifier stage. The first phase-shifting matching network may include a first series capacitor coupled to an input port and an output port of the first phase-shifting matching network, a first shunt capacitor coupled to the input port and the first series capacitor, a first shunt inductor coupled to the input port, the first series capacitor, and the first shunt capacitor, a second shunt capacitor coupled to the output port and the first series capacitor, and a second shunt inductor coupled to the output port, the first series capacitor, and the second shunt capacitor.

In another embodiment, a phase-shifting matching network is described including a series capacitor, a first shunt capacitor coupled to the series capacitor, a first shunt inductor coupled to the series capacitor and the first shunt capacitor, a second shunt capacitor coupled to the series capacitor; and a second shunt inductor coupled to the series capacitor and the second shunt capacitor, the second inductor configured to inductively couple to the first inductor.

In yet another embodiment, an electronic device is described including an antenna and an amplifier coupled to the antenna. The amplifier may include a first amplifier stage, a first phase-shifting matching network coupled to the first amplifier stage, where the first phase-shifting matching network may include a first phase shifter with embedded matching circuit, a second amplifier stage coupled to the first phase-shifting matching network, and a second phase-shifting matching network coupled to the second amplifier stage, where the second phase-shifting matching network may include a second phase shifter with embedded matching circuit.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

DETAILED DESCRIPTION OF SPECIFIC EMBODIMENTS

Figure 1:
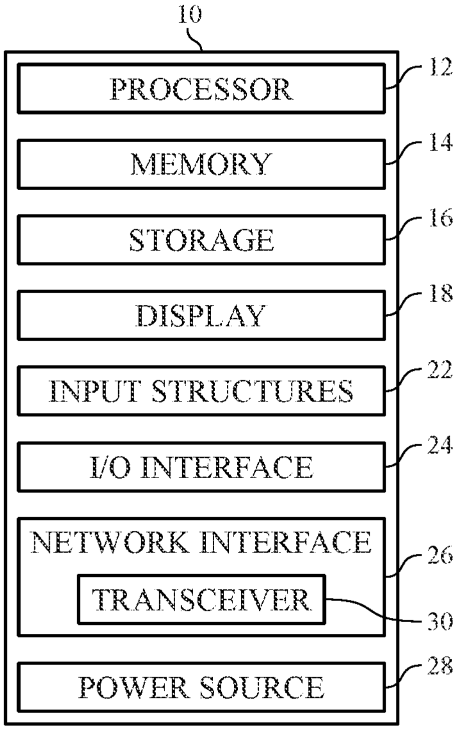
FIG. 1 is a block diagram of an electronic device, according to embodiments of the present disclosure.

When introducing elements of various embodiments of the present disclosure, the articles “a,” “an,” and “the” are intended to mean that there are one or more of the elements. The terms “comprising,” “including,” and “having” are intended to be inclusive and mean that there may be additional elements other than the listed elements. Additionally, it should be understood that references to “one embodiment” or “an embodiment” of the present disclosure are not intended to be interpreted as excluding the existence of additional embodiments that also incorporate the recited features. Furthermore, the particular features, structures, or characteristics may be combined in any suitable manner in one or more embodiments. Use of the terms “approximately,” “near,” “about,” “close to,” and/or “substantially” should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on. Additionally, the term “set” may include one or more. That is, a set may include a unitary set of one member, but the set may also include a set of multiple members.

In high frequency radio frequency (RF) applications (e.g., mmWave), a transceiver may include amplification circuitry and phase-shifting circuitry coupled to an array of antennas. The amplification circuitry and the phase-shifting circuitry may amplify and phase shift received signals and/or transmission signals respectively. The transceiver may also include matching circuitry to match impedances of the amplification circuitry and the phase-shifting circuitry. This disclosure is directed to amplifiers, such as low-noise amplifiers of a receiver or power amplifiers of a transmitter, including the amplification circuitry, the phase-shifting circuitry, and the matching circuitry. For example, an electronic device may include multiple amplifiers and an array of antennas where each amplifier is coupled to a respective antenna of the array of antenna.

In particular, each amplifier may include multiple amplifier stages. Each amplifier stage may amplify an input signal by a portion of a total amplification factor of the respective amplifier. Moreover, each amplifier may include multiple phase shifters each including a matching circuit embedded thereon. For example, each phase shifter may shift a phase of the input signal by a portion of a total phase shift value of the amplifier. Moreover, at least some phase shifters may provide an output signal at an output port having an output impedance matching (e.g., nearly matching) an input impedance of a subsequent circuit coupled thereto. In some embodiments, the subsequent circuit may include a phase shifter, an amplifier stage, and/or an antenna, among other things. Accordingly, at least some of the phase shifters may provide the output signal with an output impedance different from an input impedance associated with receiving the input signal, if the input impedance of the subsequent circuit is different from the input impedance of the respective phase shifter.

With the foregoing in mind, each amplifier may include cascaded amplifier stages and phase shifters coupled to a respective antenna. For example, an amplifier may include a first amplifier stage, a first phase shifter including a first embedded matching circuit, a second amplifier stage, and a second phase shifter including a second embedded matching circuit coupled in series (e.g., coupled in a cascaded architecture). The first amplifier stage and the second amplifier stage of the amplifier may amplify the input signal by the total amplification factor. Moreover, the first phase shifter and he second phase shifter may shift a phase of the input signal by the total phase shift value. Furthermore, the first phase shifter may provide an output signal at an output port having an output impedance matching (e.g., nearly matching) an input impedance of the second amplifier stage circuit. Similarly, the second phase shifter may provide an output signal at an output port having an output impedance matching (e.g., nearly matching) an input impedance of a subsequent circuit coupled thereto (e.g., the respective antenna, a filter, a demodulator, among other things). It should be appreciated that in other examples, one or more amplifiers of a transmitter and/or a receiver may include any other viable number of amplifier stages and phase shifters coupled together in series (e.g., cascaded).

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive signals between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer, a portable electronic or handheld electronic device such as a wireless electronic device or smartphone, a tablet, a wearable electronic device, and other similar devices. In additional or alternative embodiments, the electronic device 10 may include an access point, such as a base station, a router (e.g., a wireless or Wi-Fi router), a hub, a switch, and so on. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a $3^{rd}$ generation (3G) cellular network, universal mobile telecommunication system (UMTS), $4^{th}$ generation (4G) cellular network, Long Term Evolution® (LTE) cellular network, Long Term Evolution License Assisted Access (LTE-LAA) cellular network, $5^{th}$ generation (5G) cellular network, and/or New Radio (NR) cellular network, a $6^{th}$ generation (6G) or greater than 6G cellular network, a satellite network, a non-terrestrial network, and so on. In particular, the network interface 26 may include, for example, one or more interfaces for using a cellular communication standard of the 5G specifications that include the millimeter wave (mmWave) frequency range (e.g., 24.25-300 gigahertz (GHz)) that defines and/or enables frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
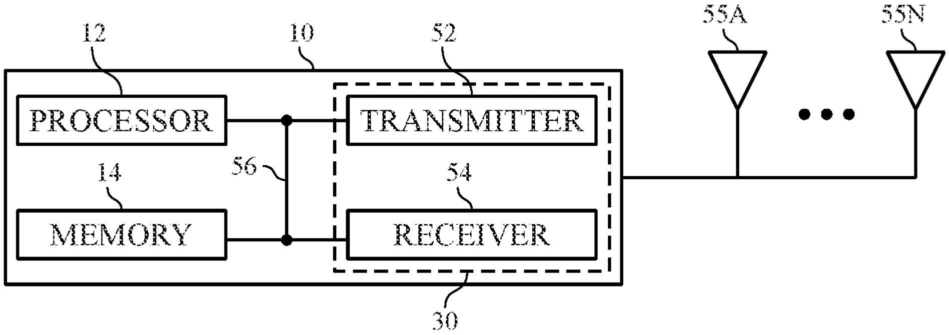
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or an array of antennas 55A-55N (collectively referred to as an antenna 55 and/or the antennas 55) may be communicatively coupled directly or indirectly (e.g., through or via another component, a communication bus, a network) to one another to transmit and/or receive signals between one another.

The electronic device 10 may include the transmitter 52 and/or the receiver 54 that respectively enable transmission and reception of signals between the electronic device 10 and an external device via, for example, a network (e.g., including base stations or access points) or a direct connection. As illustrated, the transmitter 52 and the receiver 54 may be combined into the transceiver 30. The electronic device 10 may also have the array of antennas 55A-55N electrically coupled to the transceiver 30. The antennas 55 may be configured in an omnidirectional or directional configuration, in a single-beam, dual-beam, or multi-beam arrangement, and so on. Each antenna 55 may be associated with one or more beams and various configurations.

In some embodiments, one or more antennas 55 of the array of antennas 55A-55N may be associated with an antenna group or module. The one or more antennas 55 of the antenna group may be communicatively coupled to a respective transceiver 30 and each emit radio frequency signals that may constructively and/or destructively combine to form a beam. The electronic device 10 may include multiple transmitters, multiple receivers, multiple transceivers, and/or multiple antenna groups as suitable for various communication standards. In some embodiments, a transmitter 52 and/or a receiver 54 may be coupled to one or more respective antenna 55 of the array of antennas 55A-55N. In some cases, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
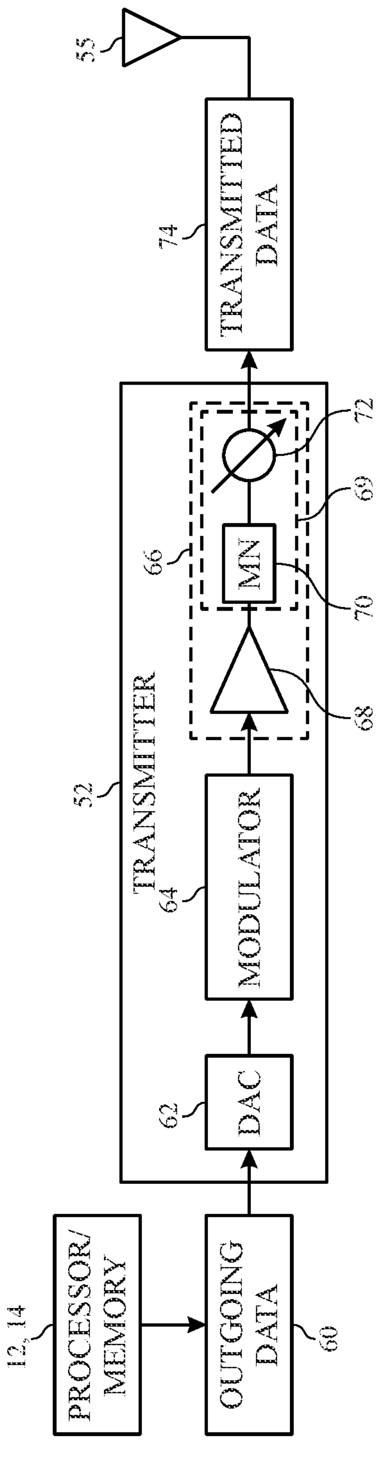
FIG. 3 is a schematic diagram of a transmitter of the electronic device of FIG. 1, according to embodiments of the present disclosure.

FIG. 3 is a schematic diagram of the transmitter 52 (e.g., transmit circuitry), according to embodiments of the present disclosure. As illustrated, the transmitter 52 may receive outgoing data 60 in the form of a digital signal to be transmitted via one or more antennas 55 (e.g., an antenna group) of the array of antennas 55A-55N. For example, the processor 12 and/or the memory 14, among other things, may provide the outgoing data 60. It should be appreciated that in some embodiments the electronic device 10 may include multiple transmitters 52 each coupled to respective one or more antennas 55.

A digital-to-analog converter (DAC) 62 of the transmitter 52 may convert the digital signal to an analog signal. A modulator 64 may combine the converted analog signal with a carrier signal to generate a radio wave. Moreover, an amplifier 66 may generate amplified signal or transmitted signals 74 based on receiving the modulated signal from the modulator 64. The amplifier 66 may drive transmission of the transmitted signals 74 via the one or more antennas 55.

The amplifier 66 may include a power amplifier (PA) 68 (e.g., the amplification circuitry) to amplify the modulated signal to a suitable voltage level. Moreover, the amplifier 66 may include a phase-shifting matching network 69. The phase-shifting matching network 69 may include phase-shifting circuitry 72 to shift a phase of the amplified signal to a desired phase. Moreover, the phase-shifting matching network 69 may include matching circuitry 70 to match an impedance of an output port of an amplifier stage of the PA 68 with an impedance of an input port of a portion of the phase-shifting circuitry 72. Alternatively or additionally, the matching circuitry 70 may include circuitry to match an impedance of a portion of an output port of the phase-shifting circuitry 72 with an impedance of an input port of an amplifier stage of the PA 68.

In some embodiments, the PA 68 may include multiple amplifier stages. Moreover, the phase-shifting circuitry 72 may include multiple phase shifters. In some cases, at least some of the phase shifters of the phase-shifting circuitry 72 may include at least a portion of the matching circuitry 70 embedded thereon. For example, the phase-shifting matching network 69 may include circuitry to perform both phase-shifting and impedance matching. The amplifier 66 may include a cascade of the multiple amplifier stages of the PA 68 and the multiple phase shifters of the phase-shifting circuitry 72, as will be appreciated.

The amplifier 66 and/or the PA 68 may be referred to as part of a radio frequency front end (RFFE), and more specifically, a transmit front end (TXFE) of the electronic device 10. Additionally, the transmitter 52 may include any suitable additional components not shown, or may not include certain of the illustrated components, such that the transmitter 52 may transmit the outgoing data 60 via the one or more antennas 55. For example, the transmitter 52 may include a filter, a mixer, and/or a digital up converter. The transmitter 52 may not include the filter if the amplifier 66 and/or the PA 68 outputs the amplified signal in or approximately in a desired frequency range (such that filtering of the amplified signal may be unnecessary).

Figure 4:
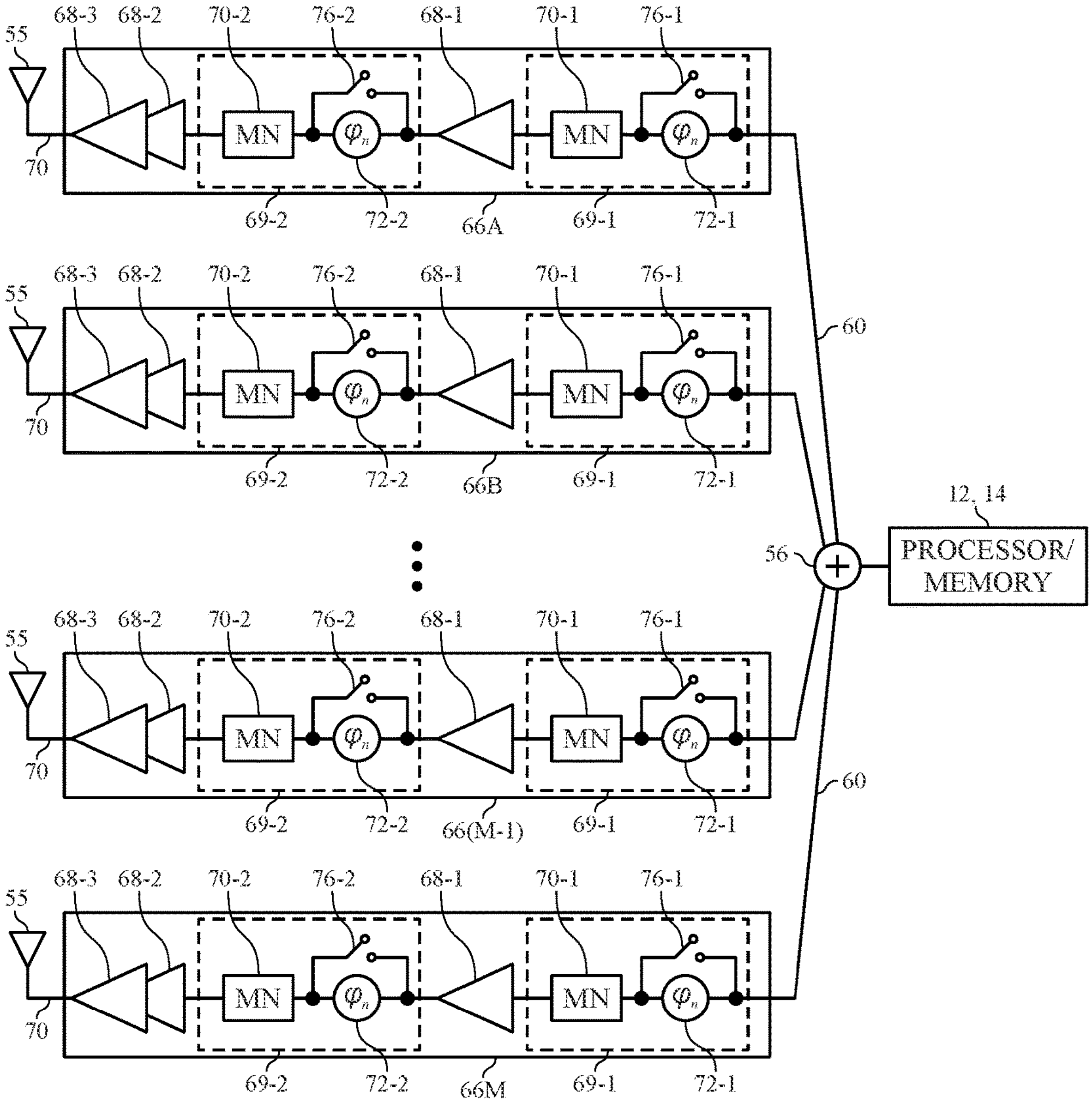
FIG. 4 is a schematic diagram of multiple transmitters of FIG. 3 including a cascade of amplifier stages and phase-shifting matching networks, according to embodiments of the present disclosure.

FIG. 4 is a schematic diagram of multiple amplifiers 66 (e.g., amplifiers 66A-66M) of one or multiple transmitters 52 discussed above. In some embodiments, the transmitter 52 may include the amplifiers 66A-66M, where each amplifier 66 may be coupled to respective one or more antennas 55 of the array of antennas 55A-55N. In alternative or additional embodiments, the electronic device 10 may include multiple transmitters 52 each including a respective amplifier 66 coupled to the respective one or more antennas 55 of the array of antennas 55A-55N.

In some embodiments, the processor 12, the memory 14, or both, among other things, may provide the outgoing data 60 to the transmitter(s) 52 via the bus system 56. As such, the amplifiers 66A-66M may receive input signals such as the modulated signals discussed above. It should be appreciated that the transmitter 52 (or the multiple transmitters 52) may include additional circuit components discussed above with respect to FIG. 3 and/or include additional or different components not shown in FIG. 3. Each of the amplifiers 66A-66M may include a respective PA 68 and a respective phase-shifting matching network 69. In turn, each phase-shifting matching network 69-1 and 69-2 may include respective phase-shifting circuitry 72-1 or 72-2 and respective matching circuitry 70-1 or 70-2. Although the discussion hereinafter may refer to the amplifier 66, it should be appreciated that the discussion may be applied to the remainder of the depicted amplifiers 66A-66M.

The PA 68 may amplify the input signals (e.g., the outgoing data 60) by a total amplification factor. The PA 68 may include amplifier stages 68-1, 68-2, and 68-3 each having a portion of the total amplification factor. Moreover, the phase-shifting circuitry 72 may shift a phase of the input signals by a total phase shift value (e.g., $\varphi_t$, 45°, 60°, 90°, 120°, 135°, and so on, among other arbitrary total phase shift values). The phase-shifting circuitry 72 may include phase shifters 72-1 and 72-2 each providing a portion of the total phase shift value.

Moreover, the matching circuitry 70 may include matching circuits 70-1 and 70-2. In the depicted embodiment, the amplifier 66 may include a cascade of the phase shifter 72-1 and the matching circuit 70-1, the amplifier stage 68-1, the phase shifter 72-2 and the matching circuit 70-2, the amplifier stage 68-2, and the amplifier stage 68-3. It should be appreciated that in alternative or additional embodiments, the PA 68 may include a different number of amplifier stages 68 and/or phase shifters 72.

The amplifier stages 68-1, 68-2, and 68-3 may each have a similar or different amplification factor. In any case, the amplifier stages 68-1, 68-2, and 68-3 may cumulatively amplify the input signals (e.g., the outgoing data 60) by the total amplification factor of the PA 68. That is, an aggregate amplification factor of the amplifier stages 68-1, 68-2, and 68-3 may correspond to the total amplification factor of the amplifier 66.

In different embodiments, each of the phase shifters 72-1 and 72-2 may shift a phase of the input signals by a similar or different phase shift value. For example, a phase shift value ($\varphi_t$, 22.5°, 30°, 45°, 60°, and so on) of each of the phase shifters 72-1 and 72-2 or the phase shifter 72-1 and 72-2 with the smallest phase shift value may determine a phase shift resolution of the phase-shifting circuitry 72 and/or the amplifier 66. Moreover, the phase shifters 72-1 and 72-2 may shift the phase of the input signals (e.g., the outgoing data 60) by the total phase shift value of the PA 68. That is, an aggregate phase shift value of the phase shifters 72-1 and 72-2 may correspond to the total phase shift value of the amplifier 66. In the depicted embodiment, the phase shifters 72-1 and 72-2 may each be coupled to a bypassing switch 76-1 and 76-2 respectively to bypass the respective portion of the phase-shifting circuitry 72. For example, the PA 68 may shift a phase of the input signals with a portion of the total phase shift value by bypassing the phase shifters 72-1 and/or 72-2.

In some embodiments, the phase shifters 72-1 and 72-2 may include embedded matching circuits 70-1 and 70-2 (e.g., matching networks (MN)) respectively. For example, each phase-shifting matching network 69-1 or 69-2 may include the respective matching circuit 70-1 or 70-2 embedded on the respective phase shifter 72-1 or 72-2. In any case, the matching circuit 70-1 may provide phase-shifted signals at an output port of the phase shifter 72-1 with an impedance matching (e.g., nearly matching) an impedance of an input port of the amplifier stage 68-1. Similarly, the matching circuit 70-2 may provide phase-shifted signals at an output port of the phase shifter 72-2 with an impedance matching (e.g., nearly matching) an impedance of an input port of the amplifier stage 68-2.

Figure 5:
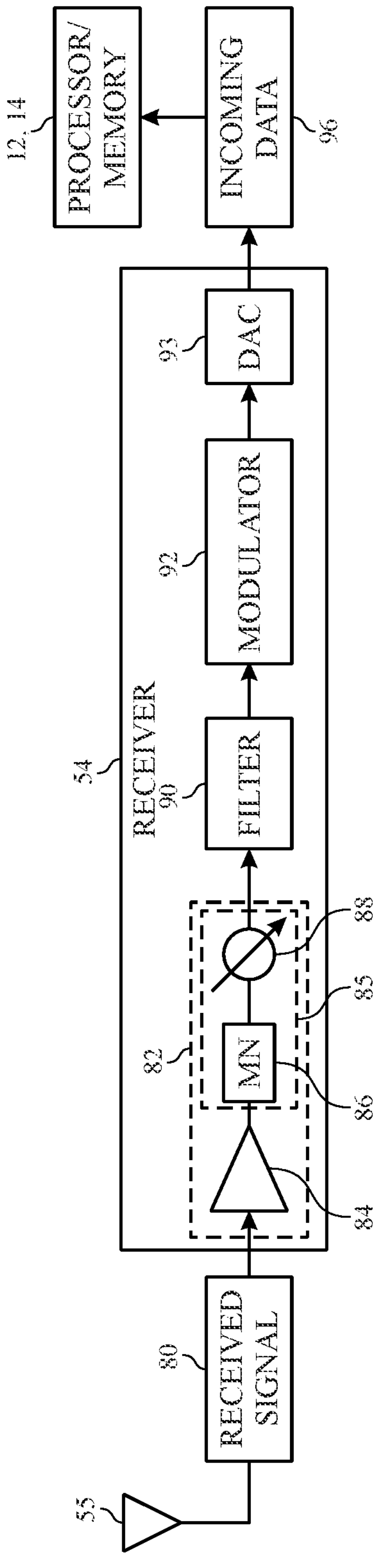
FIG. 5 is a schematic diagram of a receiver of the electronic device of FIG. 1, according to embodiments of the present disclosure.

FIG. 5 is a schematic diagram of the receiver 54 (e.g., receive circuitry), according to embodiments of the present disclosure. As illustrated, the receiver 54 may receive received signal 80 from one or more antennas 55 (e.g., an antenna group) of the array of antennas 55A-55N in the form of an analog signal. The receiver 54 may include an amplifier 82, a filter 90, a demodulator 92, and an analog-to-digital converter (ADC) 93. It should be appreciated that in some embodiments the electronic device 10 may include multiple receivers 54 each coupled to respective one or more antennas 55.

The amplifier 82 may include a low noise amplifier (LNA) 84 (e.g., the amplification circuitry) may amplify the received analog signal to a suitable level for the receiver 54 to process. Moreover, the amplifier 82 may include phase-shifting matching network 85 including phase-shifting circuitry 88 and matching circuitry 86. For example, the phase-shifting matching network 88 may include circuitry to perform both phase-shifting and impedance matching.

The phase-shifting circuitry 88 may shift a phase of the amplified signal to a desired phase. The matching circuitry 86 may match an impedance of an output port of an amplifier stage of the LNA 84 with an impedance of an input port of a portion of the phase-shifting circuitry 88. Alternatively or additionally, the matching circuitry 86 may include circuitry to match an impedance of an output port of a portion of the phase-shifting circuitry 88 with an impedance of an input port of an amplifier stage of the LNA 84.

In some cases, at least a portion of the amplifier 82 may include circuit components similar or substantially similar to circuit components of a corresponding portion of the amplifier 66. For example, the LNA 84 may include circuit components similar or substantially similar to circuit components of the PA 68 discussed above. Moreover, the phase-shifting circuitry 88 may include circuit components similar or substantially similar to circuit components of the phase-shifting circuitry 72. In some embodiments, the phase-shifting circuitry 88 may include the matching circuitry 86 disposed thereon, as will be appreciated.

The filter 90 (e.g., filter circuitry and/or software) may remove undesired noise from the received signal, such as cross-channel interference. The filter 90 may also remove additional signals received by the one or more antennas 55 that are at frequencies other than the desired signal. The filter 90 may include any suitable filter or filters to remove the undesired noise or signals from the received signal, such as a bandpass filter, a bandstop filter, a low pass filter, a high pass filter, and/or a decimation filter. The low noise amplifier 82 and/or the filter 90 may be referred to as part of the RFFE, and more specifically, a receiver front end (RXFE) of the electronic device 10.

The demodulator 92 may remove a radio frequency carrier signal and/or extract a demodulated signal (e.g., an envelope signal) from the filtered signal for processing. The ADC 93 may receive the demodulated analog signal and convert the signal to a digital signal of incoming data 96 to be further processed by the electronic device 10. For example, the processor 12 and/or the memory 14, among other things, may receive the incoming data 96. Additionally, the receiver 54 may include any suitable additional components not shown, or may not include certain of the illustrated components, such that the receiver 54 may receive the received signal 80 via the one or more antennas 55. For example, the receiver 54 may include a mixer and/or a digital down converter.

Figure 6:
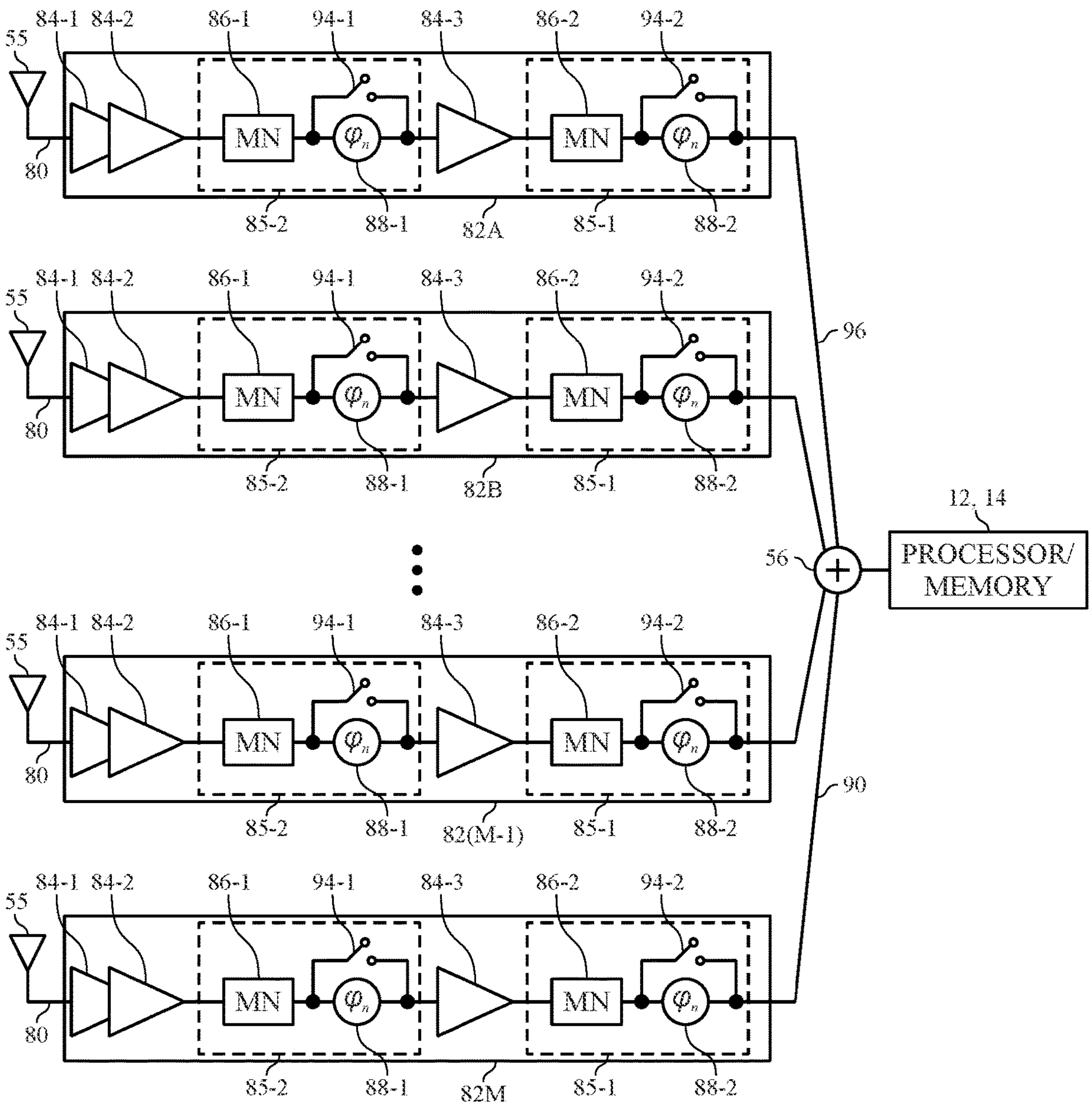
FIG. 6 a schematic diagram of multiple receivers of FIG. 4 including a cascade of amplifier stages and the phase-shifting matching networks, according to embodiments of the present disclosure, according to embodiments of the present disclosure.

FIG. 6 is a schematic diagram of multiple amplifiers 82 (e.g., amplifiers 82A-82M) of one or multiple receivers 54 discussed above. In some embodiments, the receiver 54 may include the amplifiers 82A-82M, where each amplifier 82 may be coupled to respective one or more antennas 55 of the array of antennas 55A-55N. In alternative or additional embodiments, the electronic device 10 may include multiple receivers 54 each including a respective amplifier 82 coupled to the respective one or more antennas 55 of the array of antennas 55A-55N.

In some embodiments, the processor 12, the memory 14, or both, among other things, may receive the incoming data 96 from the receiver(s) 54 via the bus system 56. As such, the amplifiers 82A-82M may receive input signals such as the received signals 80 discussed above. It should be appreciated that the receiver 54 (or the multiple receivers 54) may include additional circuit components discussed above with respect to FIG. 4 and/or include additional or different components not shown in FIG. 4. Each of the amplifiers 82A-82M may include a respective LNA 84 and a respective phase-shifting matching network 85. In turn, each phase-shifting matching network 85-1 and 85-2 may include respective phase-shifting circuitry 88-1 and 88-2 and respective matching circuitry 86-1 and 86-2. Although the discussion hereinafter may refer to the amplifier 82, it should be appreciated that the discussion may be applied to the remainder of the depicted amplifiers 82A-82M.

The LNA 84 may amplify the input signals (e.g., the received signal 80) by a total amplification factor. The LNA 84 may include amplifier stages 84-1, 84-2, and 84-3 each having a portion of the total amplification factor. Moreover, the phase-shifting circuitry 88 may shift a phase of the input signals by a total phase shift value ($\varphi_t$, 45°, 60°, 90°, 120°, 135°, and so on). The phase-shifting circuitry 88 may include phase shifters 88-1 and 88-2 each providing a portion of the total phase shift value.

Moreover, the matching circuitry 86 may include matching circuits 86-1 and 86-2. In the depicted embodiment, the amplifier 82 may include a cascade of the amplifier stage 84-1, the amplifier stage 84-2, the phase shifter 88-1 and the matching circuit 86-1, the amplifier stage 84-3, and the phase shifter 88-2 and the matching circuit 86-2. It should be appreciated that in alternative or additional embodiments, the LNA 84 may include a different number of amplifier stages 84 and/or phase shifters 88.

The amplifier stages 84-1, 84-2, and 84-3 may each have a similar or different amplification factor. In any case, the amplifier stages 84-1, 84-2, and 84-3 may cumulatively amplify the input signals (e.g., the received signal 80) by the total amplification factor of the LNA 84. That is, an aggregate amplification factor of the amplifier stages 84-1, 84-2, and 84-3 may correspond to the total amplification factor of the amplifier 82.

In different embodiments, each of the phase shifters 88-1 and 88-2 may shift a phase of the input signals by a similar or different phase shift value. For example, a phase shift value ($\varphi_r$, 22.5°, 30°, 45°, 60°, and so on) of each of the phase shifters 88-1 and 88-2 or the phase shifter 88-1 or 88-2 with the smallest phase shift value may determine a phase shift resolution of the phase-shifting circuitry 88 and/or the amplifier 82. Moreover, the phase shifters 88-1 and 88-2 may shift the phase of the input signals (e.g., the received signal 80) by the total phase shift value of the LNA 84. That is, an aggregate phase shift value of the phase shifters 88-1 and 88-2 may correspond to the total phase shift value of the amplifier 82.

Similar to the PA 68 discussed above, in the depicted embodiment, the phase shifters 88-1 and 88-2 may each be coupled to a respective bypassing switch 94-1 or 94-2 to bypass the respective portion of the PA 68. For example, the LNA 84 may shift a phase of the input signals with a portion of the total phase shift value by bypassing phase shifters 88-1 and/or 88-2. In alternative or additional embodiments, the LNA 84 may not include the bypassing switches 94-1 and 94-2, and/or the PA 68 discussed above may not include the bypassing switches 76-1 and/or 76-2.

In some embodiments, the phase shifters 88-1 and 88-2 may include embedded matching circuits 86-1 and 86-2 (e.g., matching networks (MN)) respectively. For example, each phase-shifting matching network 85-1 or 85-2 may include the respective matching circuit 86-1 or 86-2 embedded on the respective phase shifter 88-1 or 88-2. In any case, the matching circuit 86-1 may provide phase-shifted signals at an output port of the amplifier stage 84-2 with an impedance matching (e.g., nearly matching) an impedance of an input port of the phase shifter 88-1. Similarly, the matching circuit 86-2 may provide phase-shifted signals at an output port of the amplifier stage 84-3 with an impedance matching (e.g., nearly matching) an impedance of an input port of the phase shifter 88-2.

As mentioned above, the phase-shifting matching networks 69 and 85 may shift a phase of the input signals. Moreover, an input port of the phase-shifting matching networks 69 and 85 may receive signals with an impedance of an output port of the transmitting circuit transmitting the signals. Furthermore, an output port of the phase-shifting matching networks 69 and 85 may transmit the amplified and phase-shifted signals with an impedance of an output port of a subsequent circuit (e.g., the amplifier stages 68 or 84) receiving the signals. As such, the phase-shifting matching networks 69 and 85 may provide signal amplification while providing impedance matching.

A signal loss of the transmitter 52 may be improved based on including a cascade of amplifier stages 68 and phase-shifting matching networks 69. Moreover, implementing the phase-shifting matching networks 69 in the transmitter 52 may reduce circuit size of the transmitter 52, transceiver 30, and/or electronic device 10. Similarly, A signal loss of the receiver 54 may be improved based on including a cascade of amplifier stages 84 and phase-shifting matching networks 85. Implementing the phase-shifting matching networks 85 in the receiver 54 may also reduce circuit size of the receiver 54, transceiver 30, and/or electronic device 10. Accordingly, in some cases, the transmitter 52, the receiver 54, or both, may include the amplifier 82 to improve a signal loss (e.g., signal to noise ratio) and/or a size of the respective circuitry.

With the foregoing in mind, in some cases, the phase-shifting matching networks 69 and 85 may include circuitry with similar (e.g., substantially similar) schematic diagrams. For example, in some cases, the phase-shifting matching networks 69 and 85 may include circuitry with similar components having different values. FIGS. 7A-7D depict schematic diagrams of generating the phase-shifting matching network 69 or 85 discussed above.

Figure 7A:
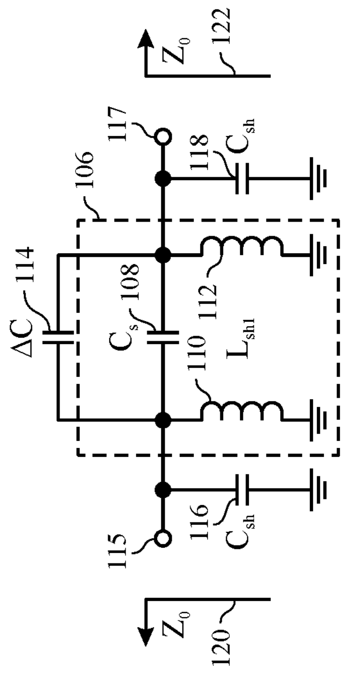
FIG. 7A is a π phase shifter with an embedded π matching network, according to embodiments of the present disclosure.

In particular, FIG. 7A is a π phase shifter 106 with an embedded 71 matching network. The π phase shifter 106 may include a series capacitor 108 ($C_s$) and shunt inductors 110 and 112 ($L_{sh1}$). Moreover, the series capacitor 108 may be coupled to a parallel capacitor 114 (ΔC), an input port 115 of the π phase shifter 106 may be coupled to a shunt capacitor 116 ($C_{sh}$), and an output port 117 of the π phase shifter 106 may be coupled to a shunt capacitor 118 ($C_{sh}$).

The shunt capacitors 116 and 118 may have a similar capacitance value ($C_{sh}$). A value of the parallel capacitor 114 (ΔC) may be selected, adjusted, and/or manipulated such that the shunt inductors 110 and 112 ($L_{sh1}$) may operate as a transformer. For example, a capacitance value ΔC of the parallel capacitor 114 and a capacitance value $C_s$ of the series capacitor 108 may be selected, adjusted, and/or manipulated based on the equation 1:

$$C_s = \frac{1}{Z_0 * \omega_0 * \sin(\varphi)} - \Delta C \qquad \text{Equation 1}$$

In equation 1, $Z_0$ may correspond to an input impedance 120 seen at the input port 115 and an output impedance 122 seen at the output port 117 of the phase-shifting matching network 69 and/or 85. The input impedance 120 and the output impedance 122 of the phase-shifting matching network 69 and/or 85 are set to equal values for selecting the capacitance $C_{sh}$ of the shunt capacitors 116 and 118 and determining the inductance $L_{sh1}$ of the shunt inductors 110 and 112. Different input impedance and/or output impedance at the input port 115 and/or output port 117 of the phase-shifting matching network 69 and/or 85 may be selected in FIG. 7D, as will be appreciated. Moreover, φ may correspond to a phase shift value of the respective phase shifter (e.g., phase shifters 72 and/or 88). Furthermore, $\omega_0$ may correspond to an operating frequency of the transmitter 52 and/or a receiver 54 including the phase-shifting matching networks 69 and 85 respectively. For example, an operating frequency of the transmitter 52 and/or a receiver 54 may be higher than 1 GHz, higher than 10 GHz, higher than 24 GHz (mmWave), and so on. Moreover, the operating frequency of the transmitter 52 and/or a receiver 54 may be selected based on a channel corresponding to an operating frequency and/or a frequency range.

The capacitance value ΔC of the parallel capacitor 114 may correspond to an inductance value $L_{sh1}$ and a coupling factor (k) of the shunt inductors 110 and 112. Each of the shunt inductors 110 and 112 ($L_{sh1}$) may have an inductance value $L_{sh1}$ based on equation 2:

$$L_{sh1} = \frac{\frac{z_0 * \cot\left(\frac{\varphi}{2}\right)}{\omega 0}}{1 + \left(\frac{z_0 * \cot\left(\frac{\varphi}{2}\right)}{\omega_0} * C_{sh} * \omega_0\right)} \qquad \text{Equation 2}$$

As mentioned above, the capacitance value ΔC of the parallel capacitor 114 (ΔC) may also correspond to the coupling factor (k) of the shunt inductors 110 and 112 ($L_{sh1}$). The shunt inductors 110 and 112 may have the coupling factor (k) based on equation 3:

$$k = \frac{L_{sh1}}{L_{sh1} - \frac{1}{\Delta C * (\omega_0^2)}} \qquad \text{Equation 3}$$

Figure 7B:
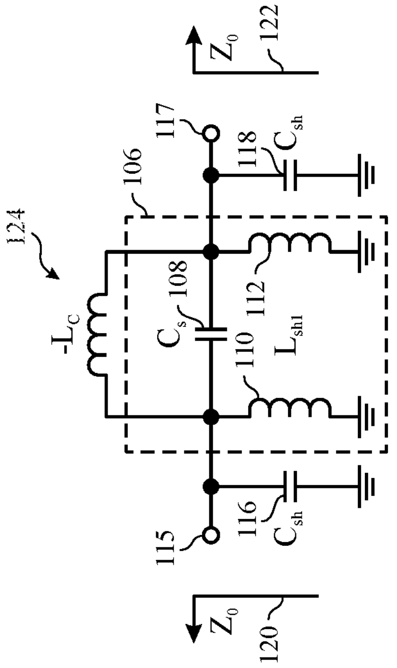
FIG. 7B is the π phase shifter of FIG. 7A with a replacement inductor having an inductance value based on a capacitance value of a parallel capacitor of the π phase shifter, according to embodiments of the present disclosure.

FIG. 7B depicts the π phase shifter 106 with a replacement inductor 124 ($-L_c$) replacing the parallel capacitor 114 (ΔC). The replacement inductor 124 mat have an inductance value $-L_c$ based on the capacitance value ΔC of the parallel capacitor 114 based on equation 4:

$$-L_c = \frac{1}{\Delta C * \omega_0^2} \qquad \text{Equation 4}$$

Figure 7C:
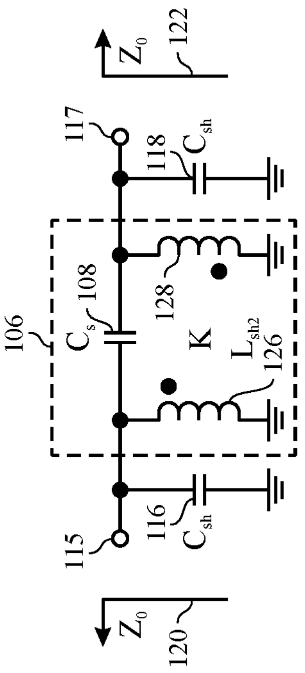
FIG. 7C is the π phase shifter of FIGS. 7A and/or 7B with shunt inductors having an adjusted inductance value based on removing the replacement inductor of the π phase shifter in FIG. 7B and/or the parallel capacitor of the π phase shifter of FIG. 7A, according to embodiments of the present disclosure.

In FIG. 7C, the π phase shifter XX may include shunt inductors 126 and 128 ($L_{sh2}$) based on removing the replacement inductor 124 ($-L_c$) of FIG. 7B and/or the parallel capacitor 114 (ΔC) of FIG. 7A. The shunt inductors 126 and 128 ($L_{sh2}$) may operate as a transformer. By removing the replacement inductor 124 ($-L_c$) of FIG. 7B and/or the parallel capacitor 114 (ΔC) of FIG. 7C, the shunt inductors 126 and 128 may have an adjusted inductance value $L_{sh2}$ based on equation 5:

$$L_{sh2} = \frac{L_{sh1} * \left(L_{sh1} * \frac{1}{\Delta C * \omega_0^2}\right)}{(2 * L_{sh1}) - \frac{1}{\Delta C * \omega_0^2}} \quad \text{Equation 5}$$

Figure 7D:
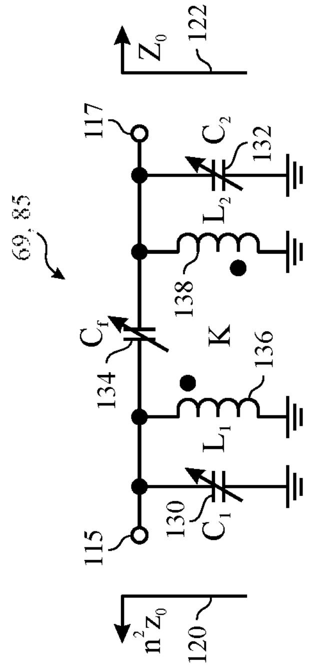
FIG. 7D is a schematic diagram of the phase-shifting matching network of FIGS. 3-6 based on the π phase shifter of FIGS. 7A-7C, according to embodiments of the present disclosure.

FIGS. 7A-7C depict schematic diagrams of the π phase shifter 106 with symmetrical input and output impedances ($z_0$) 120 and 122 at the input port 115 and the output port 117. FIG. 7D is a schematic diagram of the phase-shifting matching network 69 and/or 85 outputting the signals with an output impedance ($z_0$) 122 different from an input impedance ($n^2z_0$) 120 of the received signals. The phase-shifting matching network 69 and/or 85 may be generated based on the π phase shifter 106 of the FIGS. 7A-7C.

The phase-shifting matching network 69 and/or 85 may include a first capacitor 130 ($C_1$) (e.g., a shunt capacitor), a second capacitor 132 ($C_2$) (e.g., a shunt capacitor), a replacement capacitor 134 ($C_f$) (e.g., a series capacitor), a first inductor 136 ($L_1$), and a second inductor 138 ($L_2$). The replacement capacitor 134 ($C_f$) may be replaced by the series capacitor 108 ($C_s$) based on removing the replacement inductor 124 ($-L_c$) of FIG. 7B and/or the parallel capacitor 114 (ΔC) of FIG. 7C. The coupling factor (k) may remain the same (e.g., substantially similar or near). The first capacitor 130 ($C_1$), the second capacitor 132 ($C_2$), and the replacement capacitor 134 ($C_f$) may each include a bank of capacitors having two selectable values. The processor 12 or any other viable circuitry may switch the value of the first capacitor 130 ($C_1$), the second capacitor 132 ($C_2$), and the replacement capacitor 134 ($C_f$) to a first value and a second value. For example, the first value may correspond to a first operating frequency (e.g., a first channel) and the second value may correspond to a second operating frequency (e.g., a second channel).

For example, the first capacitor 130 ($C_1$), the first inductor 136 ($L_1$), and the replacement capacitor 134 ($C_f$) may be coupled to an output port of the PA 68 or LNA 84 having an output impedance ($n^2z_0$). Moreover, the first capacitor 130 ($C_1$) may include at least a part of parasitic capacitance of the PA 68 or LNA 84. Capacitance values $C_1$ and $C_2$ of the first capacitor 130 and the second capacitor 132 may be determined by equations 6-10 below by selecting, adjusting, and/or manipulating capacitance values of the shunt capacitors 116 and 118 ($C_{sh}$) and the parallel capacitor 114 (ΔC) based on the equations 1-5 above:

$$C_1 = \frac{C_s * (1 - n)}{n^2} + \frac{C_{sh}}{n^2} \quad \text{Equation 6}$$

$$C_2 = \frac{C_s * (n - 1)}{n} + C_{sh} \quad \text{Equation 7}$$

$$C_f = \frac{C_s}{n} \quad \text{Equation 8}$$

$$L_1 = \frac{L_{sh2}}{n^2} \quad \text{Equation 9}$$

$$L_2 = L_{sh2} \quad \text{Equation 10}$$

In some embodiments, the first capacitor 130 ($C_1$), the second capacitor 132 ($C_2$), and/or the replacement capacitor 134 ($C_f$) may be coupled to respective switches to shape switched capacitors. The switches may correspond to the switches 94 and/or 76 discussed above with respect to FIGS. 4 and 6. In such embodiments, the phase-shifting matching network 69 and/or 85 may include the first capacitor 130 ($C_1$), the second capacitor 132 ($C_2$), and/or the replacement capacitor 134 ($C_f$) in a second state to perform phase-shifting. As such, in the first state, the phase-shifting matching network 69 and/or 85 may perform the phase-shifting and the impedance matching. Moreover, the phase-shifting matching network 69 and/or 85 may bypass the first capacitor 130 ($C_1$), the second capacitor 132 ($C_2$), and/or the replacement capacitor 134 ($C_f$) in a first state to bypass the phase-shifting. In the second state, the phase-shifting matching network 69 and/or 85 may perform impedance matching. As mentioned above, each phase-shifting matching network 69 and/or 85 may shift a phase of the input a signal by a phase shift value ($\varphi_r$, 22.5°, 30°, 45°, 60°, and so on) associated with each of the phase shifters 72 and/or 88.

Although one branch of the phase-shifting matching network 69 and/or 85 is shown in FIGS. 7A-7D, it should be appreciated that the transmitter 52 and/or the receiver 54 may include multiple branches of the phase-shifting matching network 69 and/or 85. For example, the phase-shifting matching network 69-1, 69-2, 85-1, and/or 85-2 of FIGS. 4 and/or 6 may include the circuitry discussed above. Moreover, the transmitter 52 and/or the receiver 54 may provide single-ended and/or parallel signals by incorporating one or two parallel phase-shifting matching networks 69 and/or 85. As mentioned above, in some cases, the transmitter 52, the receiver 54, or both, may include the amplifier 82 to improve a signal loss (e.g., signal to noise ratio) and/or a size of the respective circuitry.

Figure 8A:
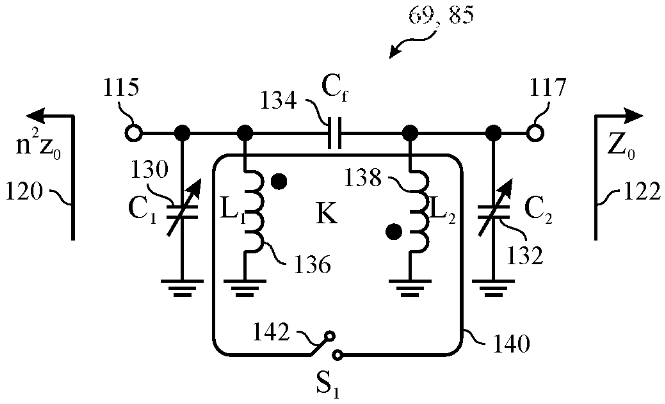
FIG. 8A is a schematic diagram of the phase-shifting matching network of FIG. 7D with a switched ring, according to embodiments of the present disclosure.

FIG. 8A is a schematic diagram of the phase-shifting matching network 69 and/or 85 with a switched ring 140. In the depicted embodiment, the first capacitor 130 ($C_1$) and the second capacitor 132 ($C_2$) may each include a bank of capacitors having two selectable values. For example, the processor 12 or any other viable circuitry may switch the value of the first capacitor 130 ($C_1$) and the second capacitor 132 ($C_2$) to a first value and a second value. In different embodiments, the replacement capacitor 134 ($C_f$) may include one or multiple capacitors (e.g., a capacitor bank). In any case, the first value of the first capacitor 130 ($C_1$) and the second capacitor 132 ($C_2$) may correspond to a first operating frequency (e.g., a first channel). Moreover, the second value of the first capacitor 130 ($C_1$) and the second capacitor 132 ($C_2$) may correspond to a second operating frequency (e.g., a second channel).

Figure 8B:
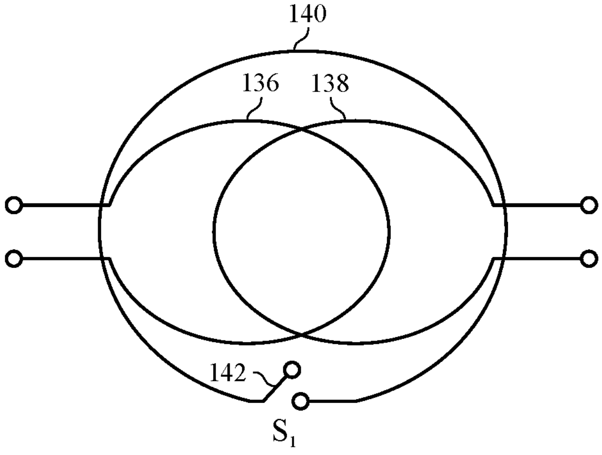
FIG. 8B is a diagram depicting the switched ring of FIG. 8A being disposed about a first inductor ($L_1$) and a second inductor ($L_2$) of the phase-shifting matching network, according to embodiments of the present disclosure.

The switched ring 140 may be disposed about the first inductor 136 ($L_1$) and the second inductor 138 ($L_2$) forming the transformer with the coupling factor k. In the depicted embodiment, the switched ring 140 may be coupled to a switch 142. For illustration, FIG. 8B is a diagram depicting switched ring 140 being disposed about the first inductor 136 ($L_1$) and the second inductor 138 ($L_2$). In a first state, the switch 142 may be open to disconnect (e.g., inductively disconnect) the switched ring 140 while the first capacitor 130 ($C_1$) and the second capacitor 132 ($C_2$) (e.g., switched capacitors) may each have first set of capacitance values. For example, the first capacitor 130 ($C_1$) and the second capacitor 132 ($C_2$) (e.g., the switching capacitors) may have a first value based on the respective switches being closed while the switch 142 may be open. In the first state, the phase-shifting matching network 69 and/or 85 may shift a phase of the signals by a first phase shift value.

Moreover, in a second state, the switch 142 may be closed to connect (e.g., inductively connect) the switched ring 140 while the first capacitor 130 ($C_1$) and the second capacitor 132 ($C_2$) (e.g., switched capacitors) may each have second set of capacitance values. For example, the first capacitor 130 ($C_1$) and the second capacitor 132 ($C_2$) (e.g., the switching capacitors) may each have a second value based on the respective switches being open. In the second state, the phase-shifting matching network 69 and/or 85 may shift a phase of the signals by a second phase shift value.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. An amplifier comprising:
a first amplifier stage;
a second amplifier stage; and
a first phase-shifting matching network coupled to the first amplifier stage and the second amplifier stage, the first phase-shifting matching network comprising:
a first series capacitor,
a first shunt capacitor,
a first shunt inductor coupled to an input port of the first phase-shifting matching network, the first series capacitor, and the first shunt capacitor at a first node,
a second shunt capacitor, and
a second shunt inductor coupled to an output port of the first phase-shifting matching network, the first series capacitor, and the second shunt capacitor at a second node.

2. The amplifier of claim 1, comprising a second phase-shifting matching network coupled to an input port of the first amplifier stage.

3. The amplifier of claim 1, comprising a third amplifier stage and a second phase-shifting matching network, the second phase-shifting matching network coupled to the second amplifier stage and the third amplifier stage.

4. The amplifier of claim 1, comprising:
a third amplifier stage;
a fourth amplifier stage; and
a second phase-shifting matching network coupled to the third amplifier stage and the fourth amplifier stage, the second phase-shifting matching network comprising:
a second series capacitor coupled to an input port of the second phase-shifting matching network and an output port of the second phase-shifting matching network;
a third shunt capacitor coupled to the input port and the second series capacitor;
a third shunt inductor coupled to the input port, the second series capacitor, and the third shunt capacitor;
a fourth shunt capacitor coupled to the output port and the second series capacitor; and
a fourth shunt inductor coupled to the output port, the second series capacitor, and the fourth shunt capacitor, the fourth shunt inductor configured to inductively couple to the first shunt inductor.

5. The amplifier of claim 4, wherein the first phase-shifting matching network and the second phase-shifting matching network form a differential circuit configured to output a differential signal.

6. The amplifier of claim 1, wherein the first phase-shifting matching network comprises a first switched capacitor and a second switched capacitor, the first switched capacitor comprising the first shunt capacitor, the second switched capacitor comprising the second shunt capacitor, and the first switched capacitor and the second switched capacitor configured to shift a phase of a signal by a first phase shift value in a first state and shift a phase of the signal by a second phase shift value in a second state.

7. The amplifier of claim 6, wherein the first phase-shifting matching network comprises a switched ring disposed about the first shunt inductor and the second shunt inductor, the switched ring comprising a switch to inductively couple and uncouple the switched ring, the first shunt inductor, and the second shunt inductor.

8. The amplifier of claim 7, wherein the second shunt inductor is configured to inductively couple to the first shunt inductor.

9. A phase-shifting matching network comprising:
a series capacitor;
a first shunt capacitor;
a first shunt inductor coupled to the series capacitor and the first shunt capacitor at a first node;
a second shunt capacitor; and
a second shunt inductor coupled to the series capacitor and the second shunt capacitor at a second node.

10. The phase-shifting matching network of claim 9, comprising a first switched capacitor and a second switched capacitor, the first switched capacitor comprising the first shunt capacitor, and the second switched capacitor comprising the second shunt capacitor.

11. The phase-shifting matching network of claim 10, wherein the first switched capacitor and the second switched capacitor are configured to operate in a first state to shift a phase of an input signal by a first phase shift value.

12. The phase-shifting matching network of claim 11, comprising a switched ring disposed about the first shunt inductor and the second shunt inductor, the switched ring comprising a switch configured to inductively couple and uncouple the switched ring, the first shunt inductor, and the second shunt inductor.

13. The phase-shifting matching network of claim 12, wherein the first switched capacitor and the second switched capacitor are configured to operate in a second state and the switched ring is configured to inductively couple to the first shunt inductor and the second shunt inductor to shift a phase of the input signal by a second phase shift value when the second switched capacitor is in the second state.

14. The phase-shifting matching network of claim 9, wherein the second shunt inductor is configured to inductively couple to the first shunt inductor.

15. The phase-shifting matching network of claim 9, comprising a parallel capacitor coupled in parallel to the series capacitor.

16. A method comprising:

amplifying, at a first amplifier stage, an input signal;

matching, at a first phase-shifting matching network, a first impedance at an output port of the first amplifier stage with a second impedance of an input port of the first phase-shifting matching network;

shifting, at the first phase-shifting matching network, a phase of the input signal as amplified by the first amplifier stage, the first phase-shifting matching network comprising a first series capacitor, a first shunt capacitor, a first shunt inductor coupled to an input port of the first phase-shifting matching network, the first series capacitor, and the first shunt capacitor at a first node, a second shunt capacitor, and a second shunt inductor coupled to an output port of the first phase-shifting matching network, the first series capacitor, and the second shunt capacitor at a second node; and amplifying, at a second amplifier stage, the input signal as shifted by the first phase-shifting matching network.

17. The method of claim 16, wherein amplifying, at the first amplifier stage, the input signal comprises amplifying, at the first amplifier stage, the input signal by a first amplification factor, the first amplifier stage configured to output a first amplified signal based on the first amplification factor.

18. The method of claim 17, wherein matching, at the first phase-shifting matching network, the first impedance at the output port of the first amplifier stage with the second impedance of the input port of the first phase-shifting matching network comprises receiving, at the first phase-shifting matching network, the first amplified signal with the first impedance of the first amplifier stage, shifting, by the first phase-shifting matching network, a phase of the first amplified signal by a first phase shift value, and outputting, by the first phase-shifting matching network, a first phase-shifted amplified signal with the second impedance based on the first phase shift value.

19. The method of claim 18, wherein amplifying, at the second amplifier stage, the input signal as shifted by the first phase-shifting matching network comprises amplifying, at the second amplifier stage, the first phase-shifted amplified signal by a second amplification factor, the second amplifier stage configured to output a second amplified signal based on the second amplification factor.

20. The method of claim 19, comprising receiving, at a second phase-shifting matching network, the second amplified signal with a third impedance of the second amplifier stage, shifting a phase of the second amplified signal by a second phase shift value, and outputting a second phase-shifted amplified signal with a fourth impedance based on the second phase shift value.

* * * * *